United States Patent
Zhu et al.

(10) Patent No.: US 9,595,443 B2
(45) Date of Patent: Mar. 14, 2017

(54) METAL GATE STRUCTURE OF A SEMICONDUCTOR DEVICE

(75) Inventors: Ming Zhu, Singapore (SG); Hui-Wen Lin, Taiping (TW); Harry-Hak-Lay Chuang, Singapore (SG); Bao-Ru Young, Zhubei (TW); Yuan-Sheng Huang, Taichung (TW); Ryan Chia-Jen Chen, Chiayi (TW); Chao-Cheng Chen, Shin-Chu (TW); Kuo-Cheng Ching, Zhubei (TW); Ting-Hua Hsieh, Hsinchu (TW); Carlos H. Diaz, Mountain View, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 857 days.

(21) Appl. No.: 13/277,642

(22) Filed: Oct. 20, 2011

(65) Prior Publication Data

US 2013/0099323 A1  Apr. 25, 2013

(51) Int. Cl.
*H01L 21/70* (2006.01)
*H01L 21/28* (2006.01)
(Continued)

(52) U.S. Cl.
CPC .. *H01L 21/28088* (2013.01); *H01L 21/82345* (2013.01); *H01L 21/823481* (2013.01);
(Continued)

(58) Field of Classification Search
None
See application file for complete search history.

(56) References Cited

U.S. PATENT DOCUMENTS

2008/0203488 A1  8/2008  Chung et al.
2010/0044806 A1* 2/2010  Hou et al. ............. 257/412
(Continued)

FOREIGN PATENT DOCUMENTS

KR  10-0868768  11/2008
KR  10-0899565  5/2009

OTHER PUBLICATIONS

Office Action and English Translation dated Jul. 10, 2013 from corresponding application No. KR 10-2011-0145085.
(Continued)

*Primary Examiner* — Mark Tornow
*Assistant Examiner* — Priya Rampersaud
(74) *Attorney, Agent, or Firm* — Hauptman Ham, LLP

(57) ABSTRACT

The invention relates to integrated circuit fabrication, and more particularly to a metal gate structure. An exemplary structure for a CMOS semiconductor device comprises a substrate comprising an isolation region surrounding and separating a P-active region and an N-active region; a P-metal gate electrode over the P-active region and extending over the isolation region, wherein the P-metal gate electrode comprises a P-work function metal and an oxygen-containing TiN layer between the P-work function metal and substrate; and an N-metal gate electrode over the N-active region and extending over the isolation region, wherein the N-metal gate electrode comprises an N-work function metal and a nitrogen-rich TiN layer between the N-work function metal and substrate, wherein the nitrogen-rich TiN layer connects to the oxygen-containing TiN layer over the isolation region.

20 Claims, 12 Drawing Sheets

(51) Int. Cl.
- *H01L 21/8234* (2006.01)
- *H01L 29/49* (2006.01)
- *H01L 29/66* (2006.01)
- *H01L 29/423* (2006.01)

(52) U.S. Cl.
CPC .... *H01L 29/4966* (2013.01); *H01L 29/66545* (2013.01); *H01L 21/823475* (2013.01); *H01L 29/42376* (2013.01)

(56) References Cited

U.S. PATENT DOCUMENTS

| | | | |
|---|---|---|---|
| 2010/0048013 A1* | 2/2010 | Thei | H01L 21/31604 |
| | | | 438/591 |
| 2010/0052067 A1* | 3/2010 | Hsu et al. | 257/369 |
| 2010/0258881 A1* | 10/2010 | Chudzik et al. | 257/410 |
| 2010/0327366 A1* | 12/2010 | Manabe et al. | 257/369 |
| 2011/0275212 A1* | 11/2011 | Chen | H01L 21/28088 |
| | | | 438/592 |
| 2012/0070948 A1* | 3/2012 | Cheng et al. | 438/199 |

OTHER PUBLICATIONS

Notice of Allowance dated Dec. 4, 2013 and English Translation from corresponding application No. KR 10-2011-0145085.

\* cited by examiner

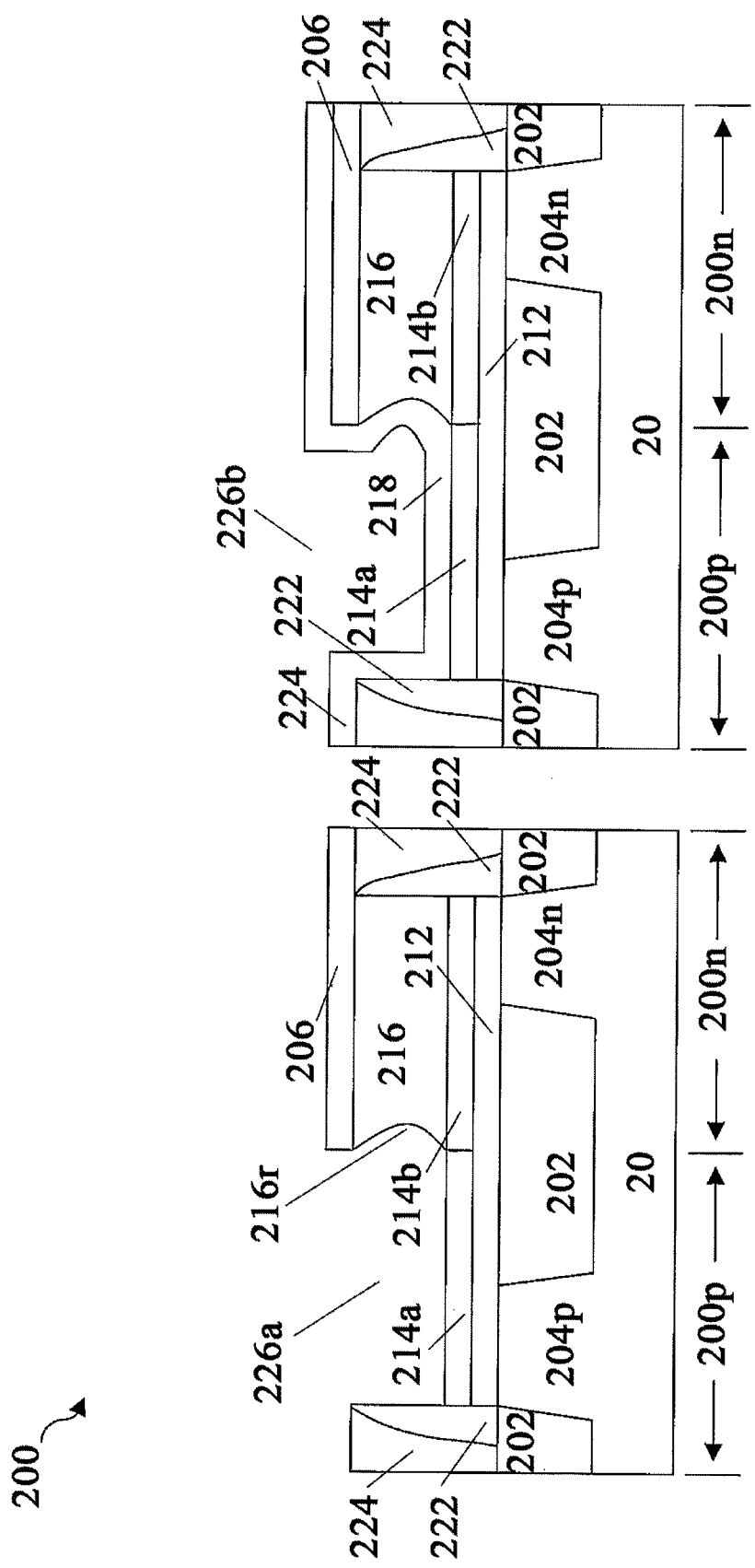

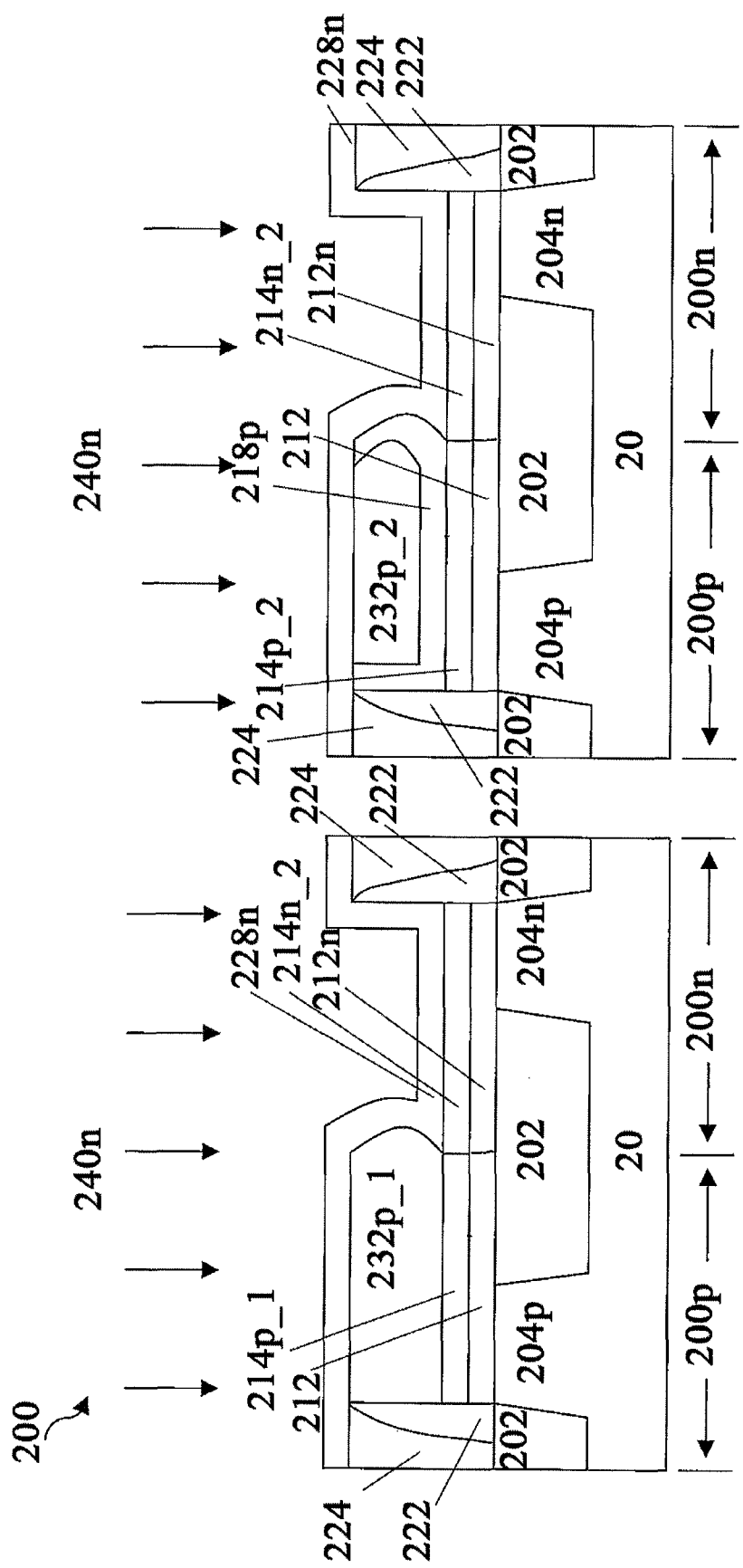

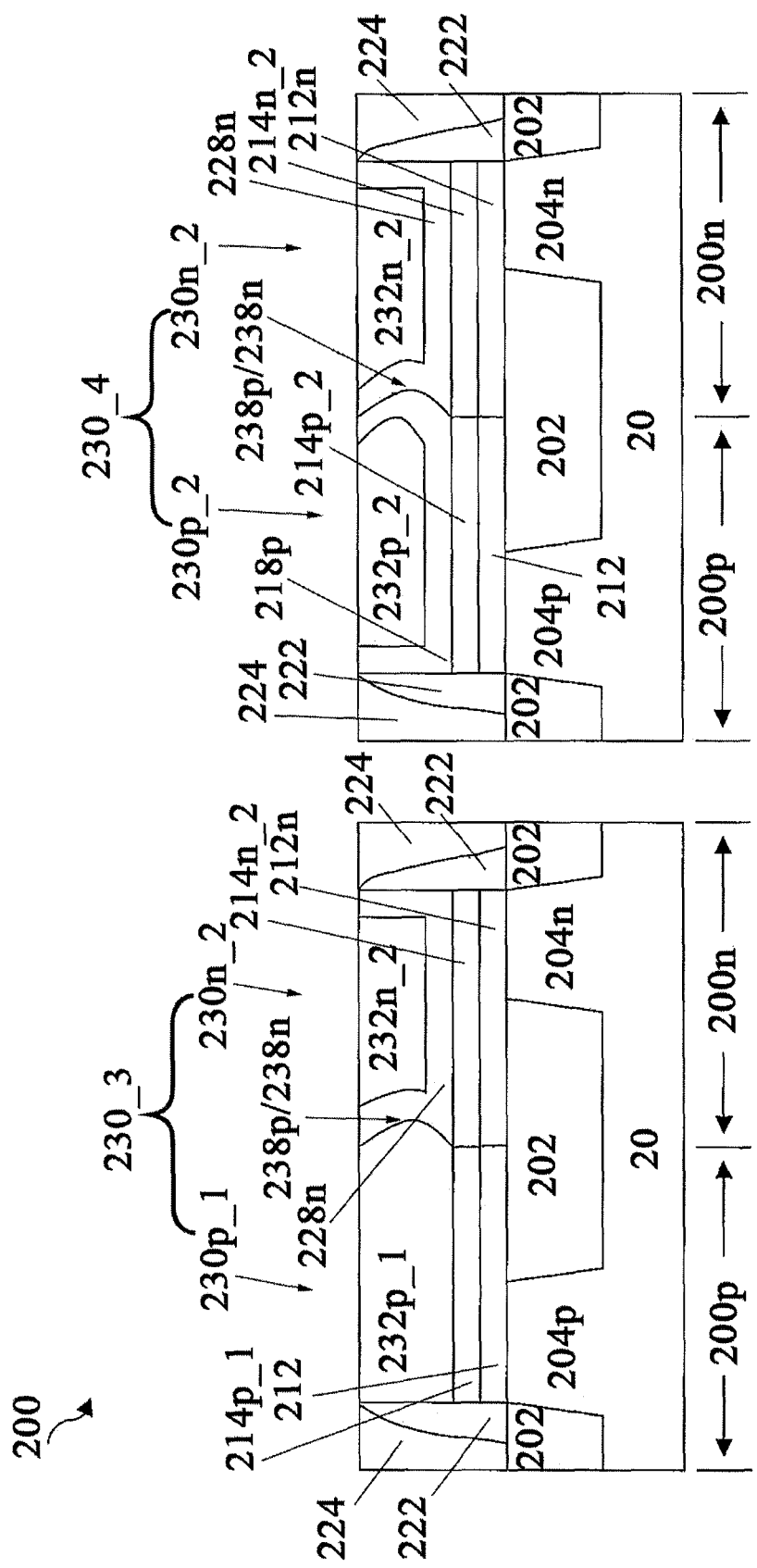

METAL GATE STRUCTURE OF A SEMICONDUCTOR DEVICE

FIELD

The invention relates to integrated circuit fabrication, and more particularly to a metal gate structure.

BACKGROUND

As the technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for a reduced number of subsequent processes, including high temperature processing, that must be performed after formation of the gate.

However, there are challenges to implement such features and processes in complementary metal-oxide-semiconductor (CMOS) fabrication. As the gate length and spacing between devices decrease, these problems are exacerbated. For example, it is difficult to achieve a stable threshold voltage for all CMOS devices because atomic diffusion between adjacent gates causes shifts in the threshold voltage of CMOS devices, thereby increasing the likelihood of device instability and/or device failure.

Accordingly, what is needed is a metal gate structure in which the threshold voltage is less sensitive to process variation.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

FIGS. 2-9D are schematic cross-sectional views of a metal gate structure of a CMOS semiconductor device at various stages of fabrication according to various embodiment of the present disclosure.

DESCRIPTION

Figure 1:
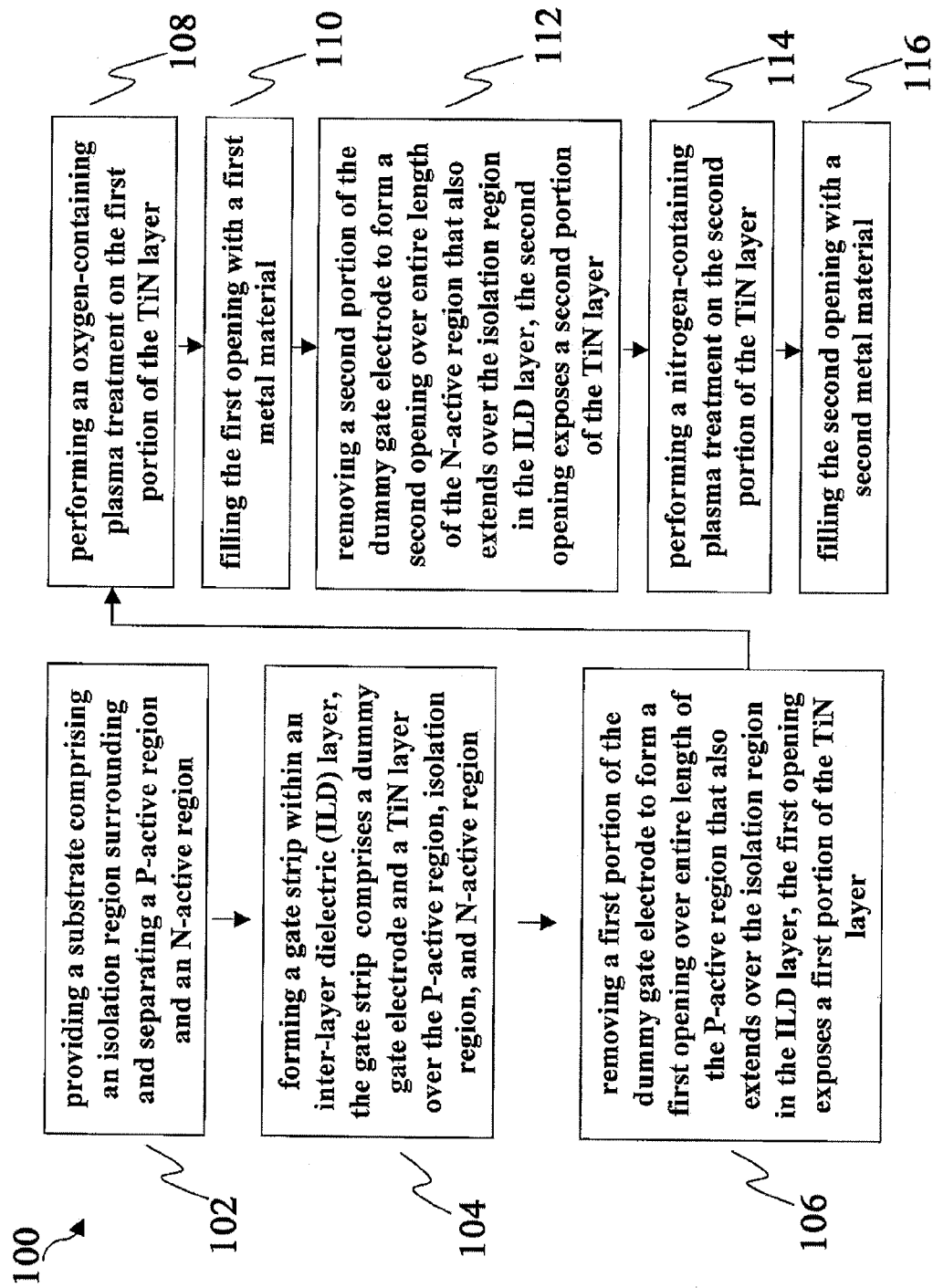
FIG. 1 is a flowchart illustrating a method of fabricating a CMOS semiconductor device comprising a metal gate structure according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. Further, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however, one skilled in the art may recognize applicability to other processes and/or use of other materials.

FIG. 1 is a flowchart illustrating a method 100 of fabricating a complementary metal-oxide-semiconductor (CMOS) semiconductor device comprising a metal gate structure according to various aspects of the present disclosure. FIGS. 2-9D are schematic cross-sectional views of a metal gate structure of a CMOS semiconductor device 200 at various stages of fabrication according to various embodiment of the present disclosure. It is understood that other parts of the CMOS semiconductor device 200 may be fabricated with normal CMOS technology processes, and thus some example CMOS processes are briefly described herein. Also, FIGS. 1 through 9D are simplified for a better understanding of the concepts of the present disclosure. For example, although the figures illustrate the metal gate structure for the CMOS semiconductor device 200, it is understood the CMOS semiconductor device 200 may be part of an integrated circuit (IC) that may include a number of other devices including resistors, capacitors, inductors, and/or fuses, etc.

Figure 2:
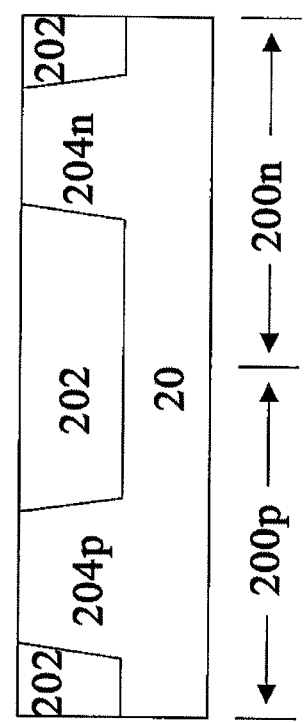

Referring to FIGS. 1 and 2, the method 100 begins with step 102 in which a substrate 20 is provided, wherein the substrate 20 comprises an isolation region 202 adjacent to and separating a P-active region 204p and an N-active region 204n. The substrate 20 may comprise a silicon substrate. The substrate 20 may alternatively comprise silicon germanium, gallium arsenic, or other suitable semiconductor materials. The substrate 20 may further comprise other features such as various doped regions, a buried layer, and/or an epitaxy layer. Furthermore, the substrate 20 may be a semiconductor on insulator such as silicon on insulator (SOI). In other embodiments, the semiconductor substrate 20 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure.

In the depicted embodiment, the isolation regions 202 may utilize isolation technology, such as local oxidation of silicon (LOCOS) or shallow trench isolation (STI), to define and electrically isolate the various active regions 204p, 204n. In the present embodiment, the isolation region 202 comprises a STI. The isolation regions 202 may comprise materials such as silicon oxide, silicon nitride, silicon oxynitride, fluoride-doped silicate glass (FSG), a low-k dielectric material, and/or combinations thereof. The isolation regions 202 may be formed by any suitable process. As one example, the formation of the STI may include patterning the semiconductor substrate 20 by a conventional photolithography process, etching a trench in the substrate 20 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Further, the P-active region 204p and N-active region 204n may include various doping configurations depending on design requirements known in the art. For example, the P-active region 204p is doped with n-type dopants, such as phosphorus or arsenic; the N-active region 204n is doped with p-type dopants, such as boron or $BF_2$. In the depicted embodiment, the P-active region 204p may act as a region configured for a p-type metal-oxide-semiconductor field-effect transistor (referred to as a pMOSFET 200p); the N-active region 204n may act as a region configured for an n-type metal-oxide-semiconductor field-effect transistor (referred to as an nMOSFET 200n).

Figure 3:
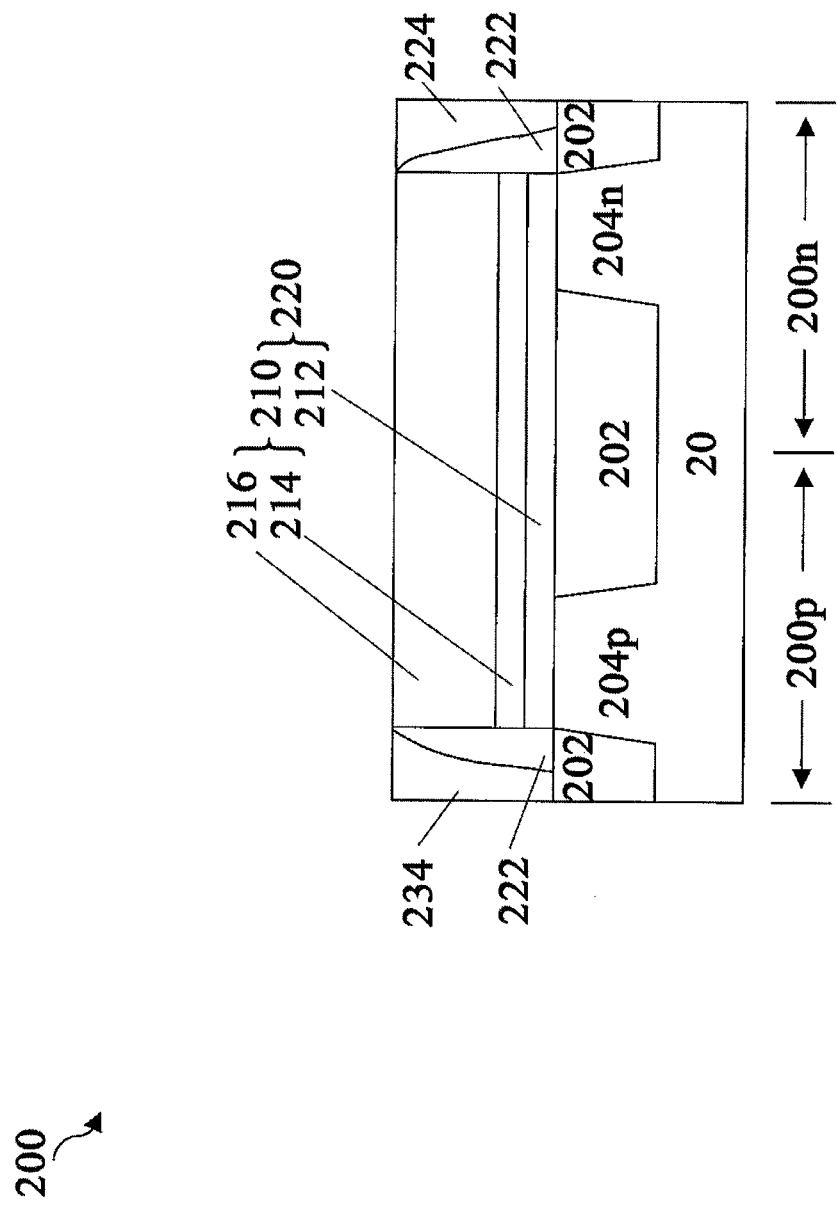

The method 100 continues with step 104 in which the structure in FIG. 3 is produced by forming a gate strip 210 within an inter-layer dielectric (ILD) layer 224, the gate strip 210 comprises a dummy gate electrode 216 and a TiN layer 214 over the P-active region 204p, isolation region 202, and N-active region 204n. In the depicted embodiment, a gate dielectric layer 212 is formed over the substrate 20. In some embodiments, the gate dielectric layer 212 may comprise silicon oxide, silicon nitride, silicon oxy-nitride, or high-k dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 212 is a high-k dielectric layer comprising $HfO_x$ with a thickness in the range of about 10 to 30 angstroms. The gate dielectric layer 212 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212 may further comprise an interfacial layer (not shown) to reduce damage between the gate dielectric layer 212 and the substrate 20. The interfacial layer may comprise silicon oxide.

Then, a TiN layer 214 is deposited over the gate dielectric layer 212 to reduce Al atomic diffusion of an N-metal gate electrode 230n_1 or 230n_2 (shown in FIG. 9A-D) to the gate dielectric layer 212. In the depicted embodiment, the TiN layer 214 has a thickness ranging from 5 to 15 angstroms. The TiN layer 214 may be formed by CVD, PVD or other suitable technique.

In a gate last process, a dummy gate electrode 216 is subsequently formed over the TiN layer 214. In some embodiments, the dummy gate electrode 216 may comprise a single layer or multilayer structure. In the present embodiment, the dummy gate electrode 216 may comprise poly-silicon. Further, the dummy gate electrode 216 may be doped poly-silicon with the uniform or gradient doping. The dummy gate electrode 216 may have a thickness in the range of about 30 nm to about 60 nm. The dummy gate electrode 216 may be formed using a low-pressure chemical vapor deposition (LPCVD) process or a plasma-enhanced chemical vapor deposition (PECVD) process.

Then, the dummy gate electrode 216, TiN layer 214 and gate dielectric layer 212 are patterned to produce the structure shown in FIG. 3. A layer of photoresist (not shown) is formed over the dummy gate electrode 216 by a suitable process, such as spin-on coating, and patterned to form a patterned photoresist feature over the dummy gate electrode 216 by a proper lithography patterning method. A width of the patterned photoresist feature is in the range of about 10 to 45 nm. The patterned photoresist feature can then be transferred using a dry etching process to the underlying layers (i.e., the gate dielectric layer 212, TiN layer 214 and dummy gate electrode 216) to form a dummy gate stack 220. In the depicted embodiment, the TiN layer 214 and dummy gate electrode 216 are combined and referred to a gate strip 210. The gate strip 210 is thus over the P-active region 204p, isolation region 202, and N-active region 204n. The photoresist layer may be stripped thereafter.

It is noted that the semiconductor device 200 may undergo other "gate last" processes and other CMOS technology processing to form various features of the semiconductor device 200. As such, the various features are only briefly discussed herein. The various components of the semiconductor device 200 may be formed prior to formation of the P-metal gate electrode and N-metal gate electrode in a "gate last" process. The various components may comprise lightly doped source/drain regions (p-type and n-type LDD) and source/drain regions (p-type and n-type S/D) (not shown) in the active regions 204p, 204n. The p-type LDD and S/D regions may be doped with B or In, and the n-type LDD and S/D regions may be doped with P or As. The various features may further comprise gate spacers 222 and an interlayer dielectric (ILD) layer 224 surrounding the dummy gate stack 220, such that the gate strip 210 is within the ILD layer 224. In the depicted embodiment, the gate spacers 222 may be formed of silicon oxide, silicon nitride or other suitable materials. The ILD layer 224 may include an oxide formed by a high-aspect-ratio process (HARP) and/or a high-density-plasma (HDP) deposition process.

The process steps up to this point have provided a gate strip 210 within the ILD layer 224; the gate strip 210 comprises the dummy gate electrode 216 and TiN layer 214 over the P-active region 204p, isolation region 202, and N-active region 204n of the substrate 20. Conventionally, the dummy gate electrode 216 is removed so that a plurality of resulting metal gate electrodes may be formed in place of the dummy gate electrode 216, i.e., a P-metal gate electrode may be formed over the P-active region 204p in place of a first portion of the dummy gate electrode 216 and a N-metal gate electrode may be formed over the N-active region 204n in place of a second portion of the dummy gate electrode 216.

If both the P-metal gate electrode and the N-metal gate electrode extends over the isolation region 202 and electrically contact each other over the isolation region 202, a concentration gradient between the P-metal gate electrode and the N-metal gate electrode may drive Al atomic diffusion of the N-metal gate electrode (with more Al material) through the TiN layer 214 to the gate dielectric layer 212, thereby changing effective thickness of the gate dielectric layer 212 resulting in an unstable threshold voltage of the pMOSFET 200p.

Accordingly, the processing discussed below with reference to FIGS. 4A-9D may form an oxygen-containing TiN layer or a fluorine-containing TiN layer over the gate dielectric layer 212. The oxygen-containing TiN layer or fluorine-containing TiN layer can be more effective to prevent Al atomic diffusion of the N-metal gate electrode to the gate dielectric layer 212 from degrading the performance of the pMOSFET 200p. Accordingly, Applicant's method of fabricating a semiconductor device 200 helps the gate dielectric layer 212 maintain its original effective thickness, thereby not changing the threshold voltage of the pMOSFET 200p.

For fabricating various embodiments of a P-metal gate electrode 230p_1 or 230p_2 of the metal gate structure 230 (shown in FIGS. 6A and 6B), the method 100 in FIG. 1 continues with step 106 in which the structures in FIGS. 4A and 4B are produced by removing a first portion of the dummy gate electrode 216 to form a first opening 226a or 226b over entire length of the P-active region 204p that also extends over the isolation region 202 in the ILD layer 224, the first opening 226a exposes a first portion 214a of the TiN layer 214 (shown in FIG. 4A).

FIGS. 4A and 4B show different embodiments of the first opening. In some TiN-exposure embodiments, the first portion of the dummy gate electrode 216 is removed to form the first opening 226a within the ILD layer 224 reaching a first portion 214a of the TiN layer 214, while a second portion 214b of the dummy gate electrode 216 is covered by a patterned hard mask 206 (shown in FIG. 4A). In the depicted embodiment, the hard mask 206 comprises TiN. Alternatively, the hard mask 206 may optionally comprise silicon oxide, silicon nitride, and/or silicon oxynitride, and may be formed using a method such as CVD or PVD. The hard mask 206 comprises a thickness in the range from about 100 to 800 angstroms.

The first portion of the dummy gate electrode 216 may be removed using a wet etch and/or a dry etch process. In some wet-etch embodiments, the wet etch process includes exposure to a hydroxide solution containing ammonium hydroxide, diluted HF, deionized water, and/or other suitable etchant solutions. The wet etch process is an isotropic etching process so that the second portion of the dummy gate electrode 216 may has a recessed portion 216r. In some dry-etch embodiments, the dry etch process may be performed under a source power of about 650 to 800 W, a bias power of about 100 to 120 W, and a pressure of about 60 to 200 mTorr, using $Cl_2$, HBr and He as etching gases. The dry etch process is an anisotropic etching process so that the second portion of the dummy gate electrode 216 may has a substantially vertical sidewall (not shown).

In some TiN-capping embodiments, the first opening 226b (shown in FIG. 4B) within the ILD layer 224 is produced by forming a TaN layer 218 over the first portion 214a of the TiN layer 214 after forming the first opening 226a. The TaN layer 218 can share charges to reduce plasma-induced damage in subsequent plasma process. In the depicted embodiment, the TaN layer 218 has a thickness ranging from 5 to 15 angstroms. The TaN layer 218 may be formed by CVD, PVD or other suitable technique.

Figures 5A, 5B:
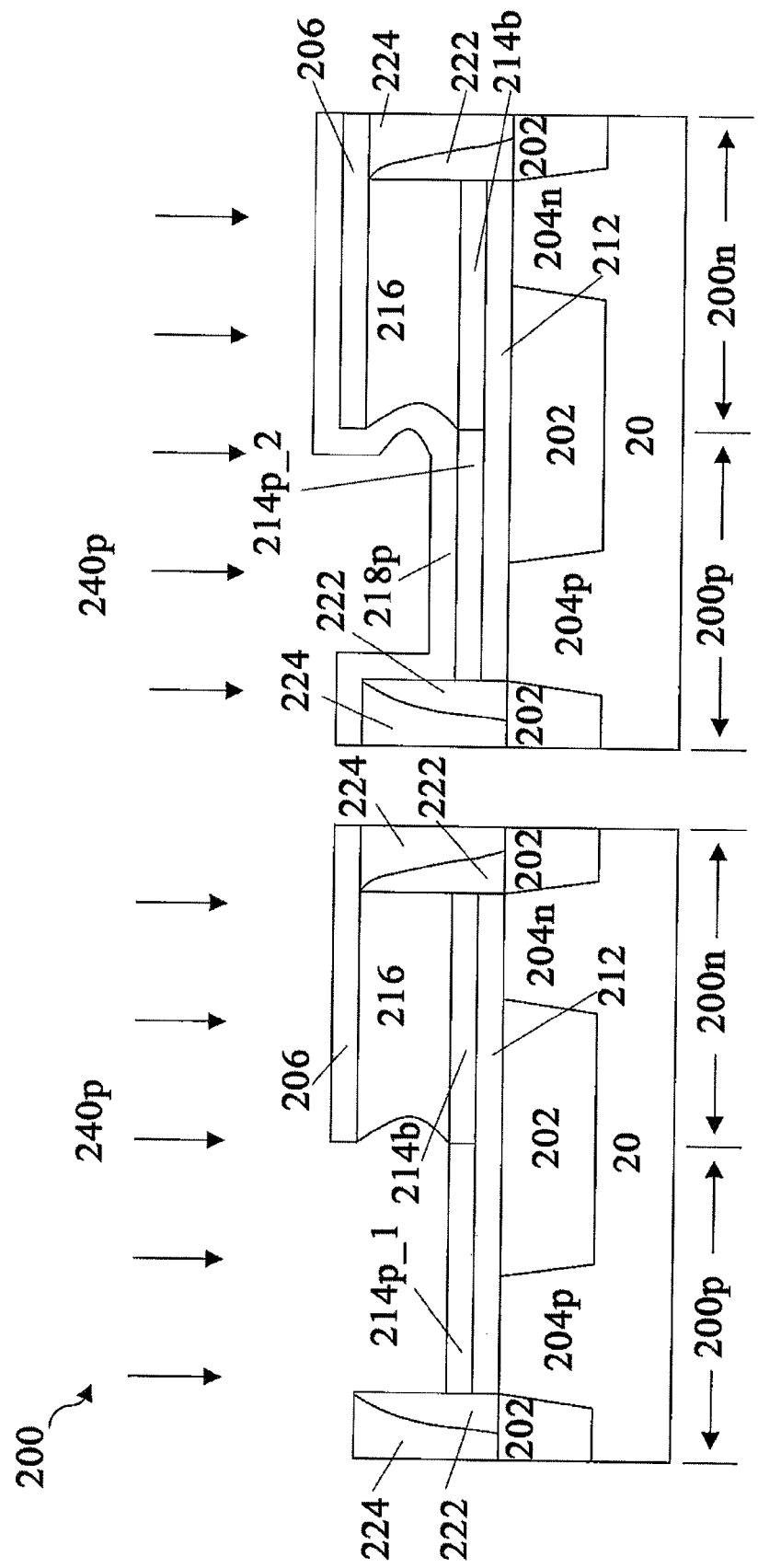

The method 100 in FIG. 1 continues with step 108 in which the structures in FIGS. 5A and 5B may be produced by performing an oxygen-containing plasma treatment 240p on the first portion 214a of the TiN layer 214, while the second portion 214b of the TiN layer 214 is covered by the patterned hard mask 206. FIGS. 5A and 5B show different embodiments of an oxygen-containing TiN layer 214p_1 in FIG. 5A and 214p_2 in FIG. 5B. In the depicted embodiment, the step of performing the oxygen-containing plasma treatment 240p is performed under a source power of about 200 to 1000 W and a pressure of about 2 mTorr to 5 mTorr, using a source gas comprising $O_2$, $O_3$, or $H_2O$.

At this point, oxygen is incorporated into the first portion 214a of the TiN layer 214, thereby changing their compositions to form an oxygen-containing TiN layer 214p_1 in FIG. 5A and 214p_2 in FIG. 5B. In some TiN-capping embodiments, the TaN layer 218 also changes composition to form an oxygen-containing TaN layer 218p (shown in FIG. 5B). The oxygen-containing TiN layer can be more effective to prevent Al atomic diffusion of the N-metal gate electrode to the gate dielectric layer 212 from degrading the performance of the pMOSFET 200p.

In an alternative embodiment, the method 100 in FIG. 1 with step 108 in which the structures in FIGS. 5A and 5B may be produced by performing a fluorine-containing plasma treatment 240p on the first portion 214a of the TiN layer 214, while the second portion 214b of the TiN layer 214 is covered by the patterned hard mask 206. FIGS. 5A and 5B show different embodiments of a fluorine-containing TiN layer 214p_1 in FIG. 5A and 214p_2 in FIG. 5B. In the depicted embodiment, the step of performing the fluorine-containing plasma treatment 240p is performed under a source power of about 500 to 3000 W and a pressure of about 50 mTorr to 100 mTorr, and at a temperature of about 100° C. to 350° C., using a source gas comprising $NF_3$, $CF_4$, and $SF_6$.

At this point, fluorine is incorporated into the first portion 214a of the TiN layer 214, thereby changing their compositions to form a fluorine-containing TiN layer 214p_1 in FIG. 5A and 214p_2 in FIG. 5B. In some TiN-capping embodiments, the TaN layer 218 also changes composition to form a fluorine-containing TaN layer 218p (shown in FIG. 5B). The fluorine-containing TiN layer can be more effective to prevent Al atomic diffusion of the N-metal gate electrode to the gate dielectric layer 212 from degrading the performance of the pMOSFET 200p.

Figures 6A, 6B:
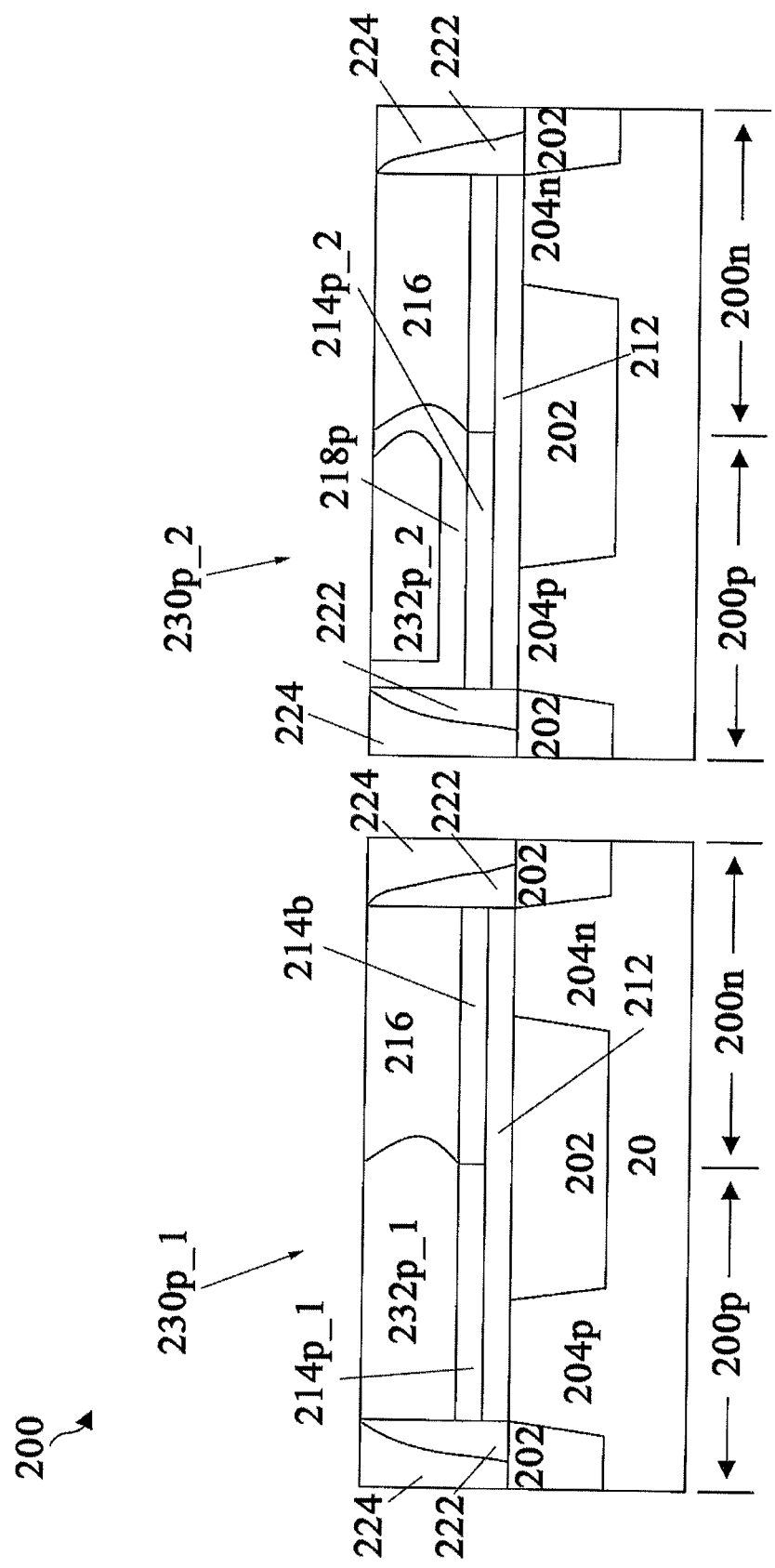

The method 100 in FIG. 1 continues with step 110 in which the structures in FIGS. 6A and 6B are produced by filling the first opening 226a or 226b with a first metal material. FIGS. 6A and 6B show different embodiments of the first metal material 232p_1 in FIG. 6A and 232p_2 in FIG. 6B. In the depicted embodiment, the first metal material comprises a P-work function metal. The P-work function metal comprises a material selected from a group of TiN, WN, TaN and Ru formed by CVD, PVD or other suitable technique. The P-work-function metal has a thickness ranging from about 30 to 80 angstroms.

In some embodiments, the first metal material may further comprise a signal metal over the P-work function metal to reduce gate electrode resistance. The signal metal comprises a material selected from a group of Al, Cu and W. The signal metal layer may be formed by CVD, PVD or other suitable technique.

In some embodiments, the first metal material may further comprise a P-barrier layer between the P-work function metal and oxygen-containing (or fluorine-containing) TiN layer 214p_1 or 214p_2 to reduce Al atomic diffusion of the N-metal gate electrode to the gate dielectric layer 212. The P-barrier layer comprises a material selected from a group of TaN and WN. The P-barrier layer has a thickness ranging from 5 to 15 angstroms. The P-barrier layer may be formed by CVD, PVD or other suitable technique.

In the present embodiment, the first metal material is deposited to fill the first opening 226a or 226b over the oxygen-containing (or fluorine-containing) TiN layer 214p_1 or 214p_2. Then, a chemical mechanical polishing (CMP) process is performed to remove the hard mask 206 and a portion of the first metal material 232p_1 or 232p_2 outside of the first opening 226a or 226b. Accordingly, the CMP process may stop when reaching the ILD layer 224, thus providing a substantially planar surface. The oxygen-containing (or fluorine-containing) TiN layer 214p_1 or 214p_2 is thus between the P-work function metal and substrate 20. In the depicted embodiment, the P-work function metal and TiN layer are combined and referred to as the P-metal gate electrode 230p_1 in FIG. 6A and 230p_2 in FIG. 6B of the metal gate structure, thereby the P-metal gate electrode 230p_1 or 230p_2 is over the P-active region 204p and extending over the isolation region 202. Further, the P-metal gate electrode 230p_2 may comprise an oxygen-containing (or fluorine-containing) TaN layer 218p between the oxygen-containing (or fluorine-containing) TiN layer 214p_2 and P-work function metal.

Figures 7A, 7B:
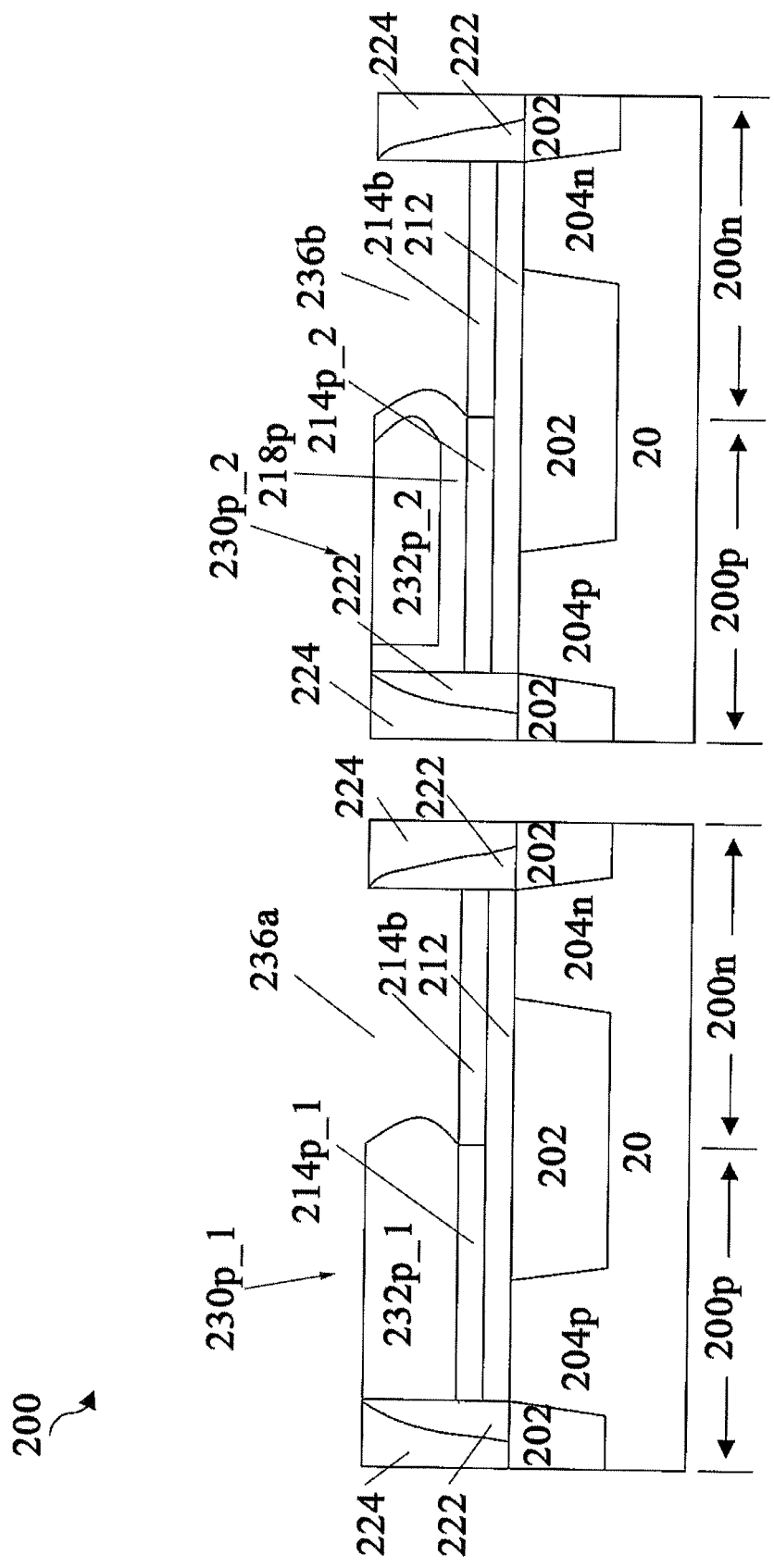

For fabricating various embodiments of a N-metal gate electrode 230n_1 or 230n_2 or 230n_3 or 230n_4 of the metal gate structure, the method 100 in FIG. 1 continues with step 112 in which the structures in FIGS. 7A, 7B, 7C, and 7D are produced by removing a second portion of the dummy gate electrode 216 to form a second opening 236a or 236b or 236c or 236d over entire length of the N-active region 204n that also extends over the isolation region 202 in the ILD layer 224, the second opening 236a or 236b exposes a second portion 214b of the TiN layer (shown in FIGS. 7A and 7B).

Figures 7C, 7D:
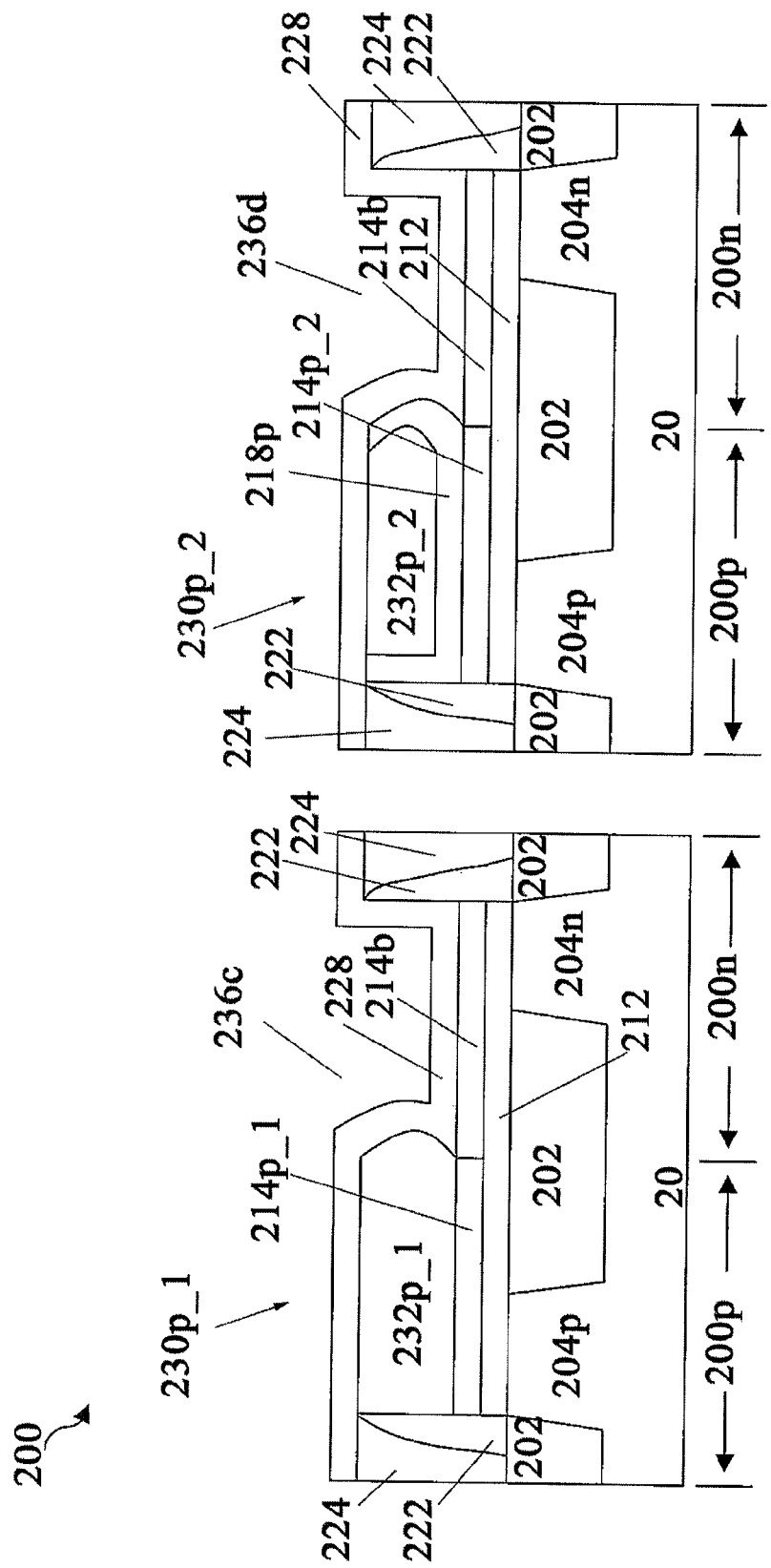

FIGS. 7A, 7B, 7C, and 7D show different embodiments of the second opening 236a in FIG. 7A, 236b in FIG. 7B, 236c in FIG. 7C, and 236d in FIG. 7D. In some TiN-exposure embodiments, using P-metal gate electrode 230p_1 or 230p_2 and ILD layer 224 as hard masks, the second portion of the dummy gate electrode 216 is removed to form the second opening 236a or 236b within the ILD layer 224 when reaching a second portion 214b of the TiN layer (shown in FIGS. 7A and 7B). The second portion of the dummy gate electrode 216 may be removed using a wet etch and/or a dry etch process, same as removing the first portion of the dummy gate electrode 216.

In some TiN-capping embodiments, the second opening 236c or 236d (shown in FIGS. 7C and 7D) within the ILD layer 224 is produced by forming a TaN layer 228 over the second portion 214b of the TiN layer after forming the second opening 236a or 236b. The TaN layer 228 can share charges to release plasma-induced damage in subsequent plasma process. In the depicted embodiment, the TaN layer 228 has a thickness ranging from 5 to 15 angstroms. The TaN layer 228 may be formed by CVD, PVD or other suitable technique.

The method 100 in FIG. 1 continues with step 114 in which the structures in FIGS. 8A, 8B, 8C, and 8D may be produced by performing a nitrogen-containing plasma treatment 240n on the second portion 214b of the TiN layer 214, while the first portion 214p_1 or 214p_2 of the TiN layer 214 is covered by the first metal material 232p_1 or 232p_2. FIGS. 8A, 8B, 8C, and 8D show different embodiments of a nitrogen-containing TiN layer 214n_1 in FIGS. 8A and 8B, 214n_2 in FIGS. 8C and FIG. 8D. In the depicted embodiment, the step of performing the nitrogen-containing plasma treatment 240n is performed under a source power of about 200 to 1000 W and a pressure of about 2 mTorr to 5 mTorr, using a source gas comprising $N_2$ or $NH_3$.

Figures 8A, 8B:
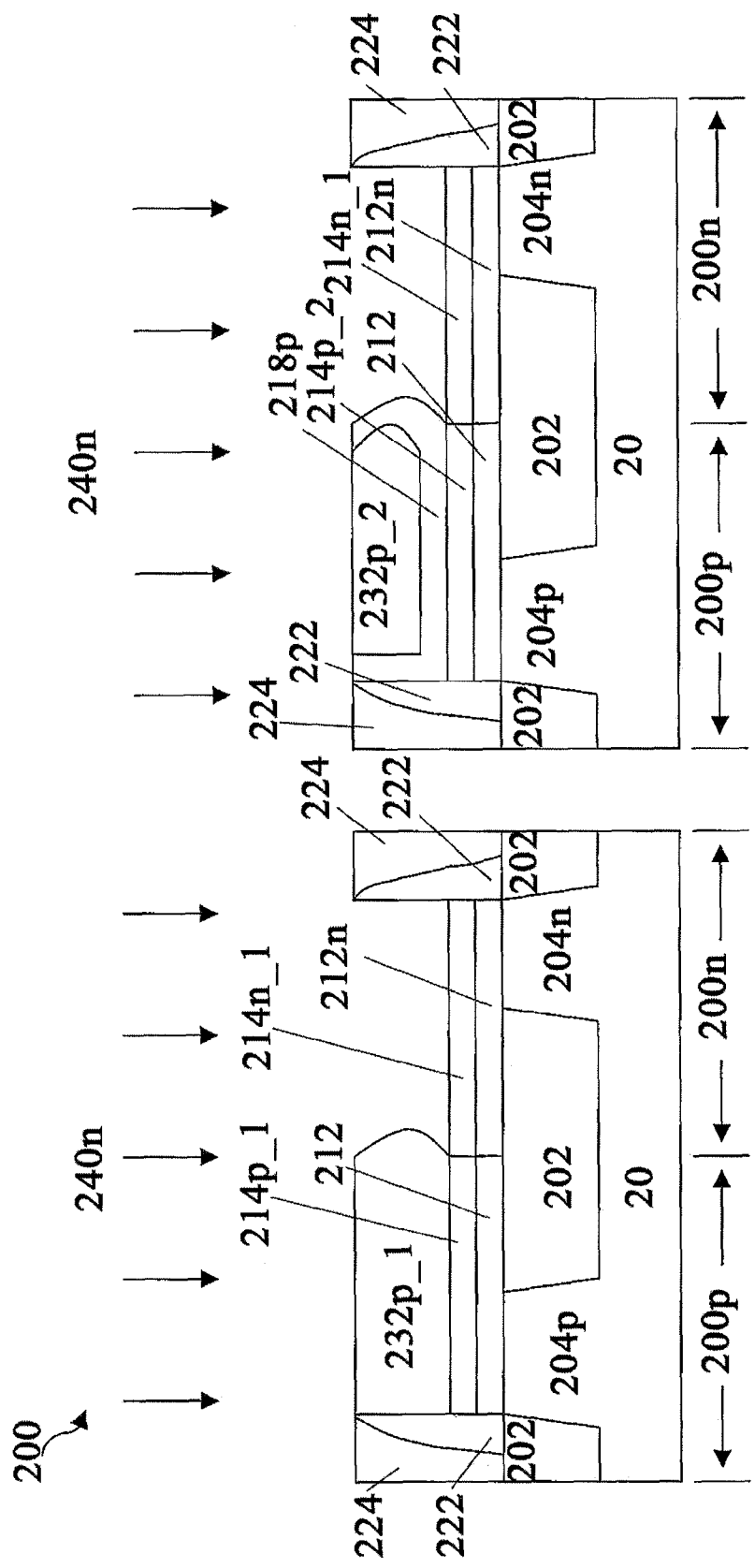

At this point, nitrogen is incorporated into the second portion 214b of the TiN layer, thereby changing the composition to form a nitrogen-rich TiN layer 214n_1 in FIGS. 8A and 8B, 214n_2 in FIGS. 8C and FIG. 8D. The nitrogen-rich TiN layer can promote Time-Dependent Dielectric Breakdown (TDDB) of the nMOSFET 200n. In the depicted embodiment, the nitrogen-rich TiN layer 214n_1 or 214n_2 connects to the oxygen-containing TiN layer 214p_1 or 214p_2 over the isolation region 202. In some TiN-capping embodiments, the TaN layer 228 also changes composition to form a nitrogen-rich TaN layer 228n (shown in FIGS. 8C and 8D). In some embodiments, a portion of the gate dielectric layer 212 between the nitrogen-rich TiN layer 214n and substrate 20 also changes composition to form a nitrogen-containing gate dielectric layer 212n.

The method 100 in FIG. 1 continues with step 116 in which the structures in FIGS. 9A, 9B, 9C, and 9D are produced by filling the second opening 236a or 236b or 236c or 236d with a second metal material. FIGS. 9A, 9B, 9C, and 9D show different embodiments of the second metal material 232n_1 in FIGS. 9A and 9B, 232n_2 in FIGS. 9C and 9D. In the depicted embodiment, the second metal material comprises an N-work function metal. The N-work function metal comprises a material selected from a group of Ti, Ag, Al, TiAl, TiAlN, TaC, TaCN, TaSiN, Mn, and Zr formed by CVD, PVD or other suitable technique. The N-work function metal has a thickness ranging from about 30 to 80 angstroms.

In some embodiments, the second metal material may further comprise a signal metal layer over the N-work function metal layer to reduce gate electrode resistance. The signal metal layer comprises a material selected from a group of Al, Cu and W. The signal metal layer may be formed by CVD, PVD or other suitable technique.

In some embodiments, the second metal material may further comprise an N-barrier layer between the N-work function metal and nitrogen-rich TiN layer 214n_1 or 214n_2 to reduce Al atomic diffusion of the N-metal gate electrode to the gate dielectric layer 212n. The N-barrier layer comprises a material selected from a group of TaN and WN. The N-barrier layer has a thickness ranging from 5 to 15 angstroms. The N-barrier layer may be formed by CVD, PVD or other suitable technique.

In the present embodiment, the second metal material is deposited to fill the second opening 236a or 236b or 236c or 236d over the nitrogen-rich TiN layer 214n_1 or 214n_2. Then, a CMP process is performed to remove a portion of the second metal material outside of the second opening. Accordingly, the CMP process may stop when reaching the ILD layer 224, thus providing a substantially planar surface. The nitrogen-rich TiN layer is thus between the N-work function metal and substrate 20.

Figures 9A, 9B:
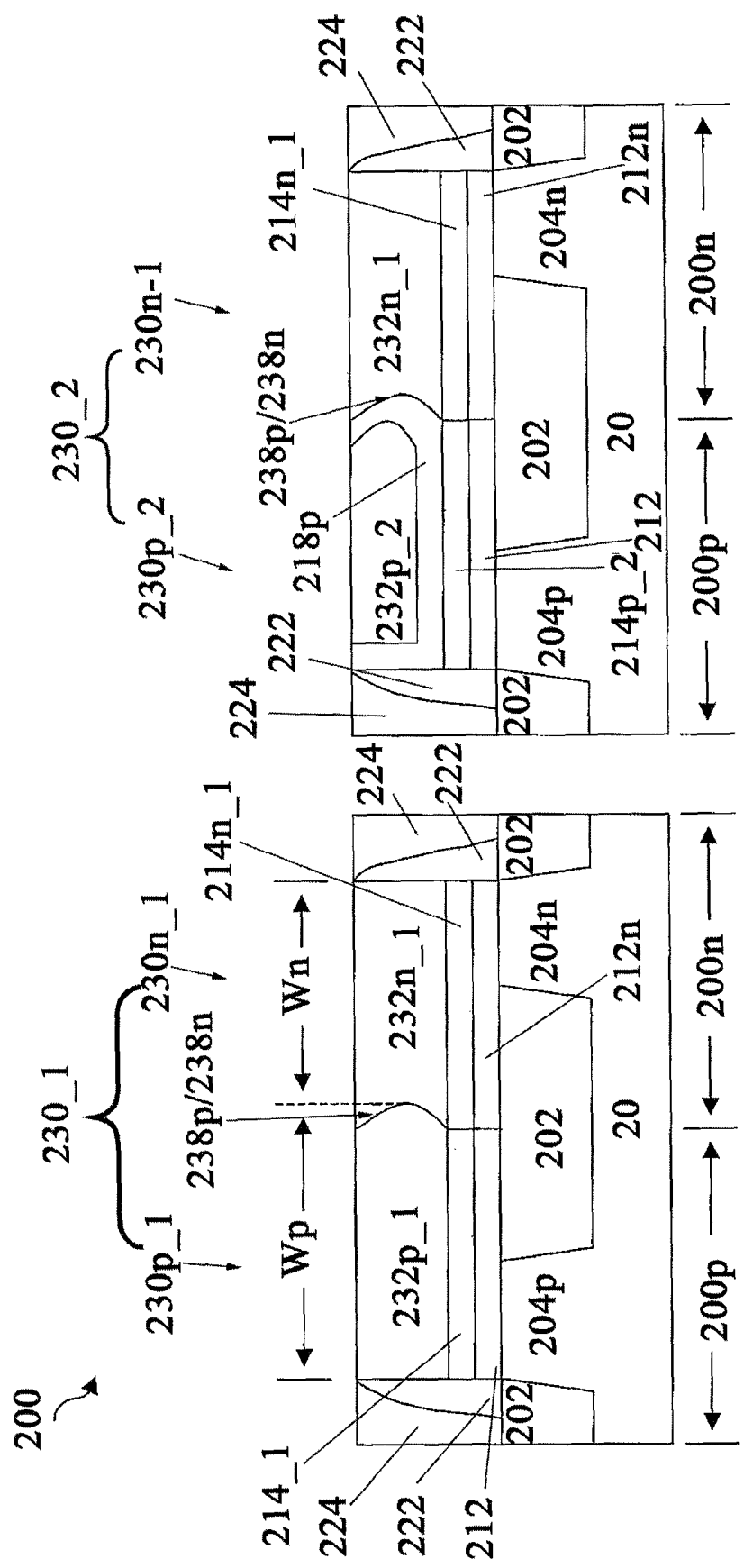

In the depicted embodiment, the N-work function metal and the TiN layer are combined and referred to as the N-metal gate electrode 230n_1 in FIGS. 9A and 9B, 230n_2 in FIGS. 9C and 9D of the metal gate structure 230, thereby the N-metal gate electrode 230n is over the N-active region 204n and extending over the isolation region 202. Further, the N-metal gate electrode 230n_2 may comprise a nitrogen-rich TaN layer 228n between the nitrogen-rich TiN layer 214n_2 and N-work function metal.

In some embodiments, the P-metal gate electrode 230p_1 or 230p_2 and the N-metal gate electrode 230n_1 or 230n_2 are electrically contacting to each other over the isolation region 202, wherein the P-metal gate electrode and the N-metal gate electrode are combined and referred to as a metal gate structure 230_1 in FIG. 9A, 230_2 in FIG. 9B, 230_3 in FIG. 9C, and 230_4 in FIG. 9D.

In some wet-etch embodiments, the N-metal gate electrode has a recess 238n and P-metal gate electrode 230p has a protrusion 238p extending into the recess 238n. In one embodiment, a ratio of a maximum width Wp of the P-metal gate electrode 230p_1 or 230p_2 to a minimum width Wn of the N-metal gate electrode 230n_1 or 230n_2 is from about 1.05 to 1.2. In one embodiment, a ratio of a width of the P-metal gate electrode to a width of the N-metal gate electrode is from about 0.8 to 1.2. In some dry-etch embodiments, contact portion of the N-metal gate electrode and P-metal gate electrode is substantially vertical (not shown).

In one embodiment, the metal gate electrode may further comprise the oxygen-containing TaN layer 218p between the N-work function metal and the P-work function metal (230_2 in FIG. 9B and 230_4 in 9D). In another embodiment, the metal gate electrode may further comprise the nitrogen-rich TaN layer 228n between the N-work function metal and the P-work function metal (230_3 in FIG. 9C and 230_4 in 9D).

In the depicted embodiment, the oxygen-containing (or fluorine-containing) TiN layer 214p_1 or 214p_2 can be more effective to prevent Al atomic diffusion from the N-metal gate electrode to the gate dielectric layer 212 from degrading the performance of the pMOSFET 200p. Accordingly, Applicant's method of fabricating a CMOS semiconductor device 200 may provide the P-metal gate electrode a stable work function to maintain a stable threshold voltage of the pMOSFET 200p, thereby enhancing the device performance.

It is understood that the CMOS semiconductor device 200 may undergo further CMOS processes to form various features such as contacts/vias, interconnect metal layers, dielectric layers, passivation layers, etc.

In accordance with embodiments, a CMOS semiconductor device comprises a substrate comprising an isolation region adjacent to and separating a P-active region and an N-active region; a P-metal gate electrode over the P-active region and extending over the isolation region, wherein the P-metal gate electrode comprises a P-work function metal and an oxygen-containing TiN layer between the P-work function metal and substrate; and an N-metal gate electrode over the N-active region and extending over the isolation region, wherein the N-metal gate electrode comprises an N-work function metal and a nitrogen-rich TiN layer between the N-work function metal and substrate, wherein the nitrogen-rich TiN layer connects to the oxygen-containing TiN layer over the isolation region.

In accordance with other embodiments, a method of fabricating a CMOS semiconductor device comprises providing a substrate comprising an isolation region adjacent to and separating a P-active region and an N-active region; forming a gate strip within an inter-layer dielectric (ILD) layer, the gate strip comprises a dummy gate electrode and a TiN layer over the P-active region, isolation region, and N-active region; removing a first portion of the dummy gate electrode to form a first opening over entire length of the P-active region that also extends over the isolation region in the ILD layer, the first opening exposes a first portion of the TiN layer; performing an oxygen-containing plasma treatment on the first portion of the TiN layer; filling the first opening with a first metal material; removing a second portion of the dummy gate electrode to form a second opening over entire length of the N-active region that also extends over the isolation region in the ILD layer, the second opening exposes a second portion of the TiN layer; performing a nitrogen-containing plasma treatment on the second portion of the TiN layer; and filling the second opening with a second metal material.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A complementary metal-oxide-semiconductor (CMOS) semiconductor device comprising:
    a substrate comprising an isolation region adjacent to and separating a P-active region and an N-active region;
    a P-metal gate electrode over the P-active region and extending over the isolation region, wherein the P-metal gate electrode comprises a P-work function metal and an oxygen-containing TiN layer between the P-work function metal and substrate; and
    an N-metal gate electrode over the N-active region and extending over the isolation region, wherein the N-metal gate electrode comprises an N-work function metal and a nitrogen-rich TiN layer between the N-work function metal and substrate, wherein the nitrogen-rich TiN layer connects to the oxygen-containing TiN layer over the isolation region.

2. The CMOS semiconductor device of claim 1 further comprising an oxygen-containing TaN layer between the oxygen-containing TiN layer and the P-work function metal.

3. The CMOS semiconductor device of claim 1 further comprising a nitrogen-rich TaN layer between the nitrogen-rich TiN layer and the N-work function metal.

4. The CMOS semiconductor device of claim 1 further comprising a nitrogen-containing gate dielectric layer between the nitrogen-rich TiN layer and substrate.

5. The CMOS semiconductor device of claim 1, wherein the N-metal gate electrode has a recess and P-metal gate electrode has a protrusion extending into the recess.

6. The CMOS semiconductor device of claim 1, wherein a ratio of a maximum width of the P-metal gate electrode to a minimum width of the N-metal gate electrode is from about 1.05 to 1.2.

7. The CMOS semiconductor device of claim 1 further comprising an oxygen-containing TaN layer between the N-work function metal and the P-work function metal.

8. The CMOS semiconductor device of claim 1 further comprising a nitrogen-rich TaN layer between the N-work function metal and the P-work function metal.

9. The CMOS semiconductor device of claim 1, wherein the N-work-function metal comprises a metal selected from a group of Ti, Ag, Al, TiAl, TiAlN, TaC, TaCN, TaSiN, Mn, and Zr.

10. The CMOS semiconductor device of claim 1, wherein the P-work-function metal comprises a metal selected from a group of TiN, WN, TaN, and Ru.

11. A complementary metal-oxide-semiconductor (CMOS) semiconductor device comprising:
    a substrate comprising an isolation region separating a P-active region and an N-active region;
    a P-metal gate electrode over the P-active region and extending over the isolation region, wherein the P-metal gate electrode comprises a P-work function metal and a doped TiN layer between the P-work function metal and substrate; and
    an N-metal gate electrode over the N-active region and extending over the isolation region, wherein the N-metal gate electrode comprises an N-work function metal and a nitrogen-rich TiN layer between the N-work function metal and substrate, wherein the nitrogen-rich TiN layer contacts the doped TiN layer over the isolation region.

12. The CMOS semiconductor device of claim 11, wherein the doped TiN layer comprises an oxygen-containing TiN layer or a fluorine-containing TiN layer.

13. The CMOS semiconductor device of claim 11, wherein a ratio of a width of the P-metal gate to a width of the N-metal gate ranges from about 0.8 to about 1.2.

14. The CMOS semiconductor device of claim 11, wherein the P-metal gate comprises a signal metal over the P-work function metal.

15. The CMOS semiconductor device of claim 11, wherein the N-metal gate comprises a signal metal over the N-work function metal.

16. The CMOS semiconductor device of claim 11, further comprising a high-k dielectric layer between the doped TiN layer and the substrate and between the nitrogen-rich TiN layer and the substrate.

17. The CMOS semiconductor device of claim 11, wherein the P-metal gate comprises a P-barrier layer between the P-work function metal and the doped TiN layer.

18. The CMOS semiconductor device of claim 11, wherein the N-metal gate comprises an N-barrier layer between the N-work function metal and the nitrogen-rich TiN layer.

19. A complementary metal-oxide-semiconductor (CMOS) semiconductor device comprising:
- a substrate comprising an isolation region separating a P-active region and an N-active region; and
- a gate structure over the substrate, the gate structure comprises:
  - a P-metal gate electrode extending over the isolation region, wherein the P-metal gate electrode comprises a P-work function metal and a doped TiN layer between the P-work function metal and substrate;
  - an N-metal gate electrode extending over the isolation region, wherein the N-metal gate electrode comprises an N-work function metal and a nitrogen-rich TiN layer between the N-work function metal and substrate, wherein the nitrogen-rich TiN layer contacts the doped TiN layer over the isolation region; and
  - a TaN layer between the P-metal gate electrode and the N-metal gate electrode.

20. The CMOS semiconductor device of claim 19, wherein the TaN layer comprises a nitrogen-rich TaN layer, an oxygen-containing TaN layer or a fluorine-containing TaN layer.

* * * * *